(12) United States Patent
Franklin et al.

(10) Patent No.: US 11,508,558 B2
(45) Date of Patent: Nov. 22, 2022

(54) THERMAL REPEATABILITY AND IN-SITU SHOWERHEAD TEMPERATURE MONITORING

(71) Applicant: Applied Materials, Inc., Santa Clara, CA (US)

(72) Inventors: Timothy Joseph Franklin, Campbell, CA (US); Steven E. Babayan, Los Altos, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 103 days.

(21) Appl. No.: 16/834,814

(22) Filed: Mar. 30, 2020

(65) Prior Publication Data

US 2020/0227242 A1 Jul. 16, 2020

Related U.S. Application Data

(63) Continuation of application No. 15/405,758, filed on Jan. 13, 2017, now Pat. No. 10,607,817.
(Continued)

(51) Int. Cl.
*H01J 37/32* (2006.01)
*B05B 1/00* (2006.01)
(Continued)

(52) U.S. Cl.
CPC ........ *H01J 37/32449* (2013.01); *B05B 1/005* (2013.01); *B05B 1/18* (2013.01);
(Continued)

(58) Field of Classification Search
CPC ......... C23C 16/45565; H01J 37/32522; H01L 21/67248
See application file for complete search history.

(56) References Cited

U.S. PATENT DOCUMENTS 5,906,683 A * 5/1999 Chen ................. C23C 16/45565
118/724
8,187,414 B2 5/2012 Hardin et al.
(Continued)

FOREIGN PATENT DOCUMENTS

CN 1742113 A 3/2006
CN 100495655 C 6/2009
(Continued)

OTHER PUBLICATIONS

China Application No. 201711021998.3 Office Action dated Jan. 6, 2021.
(Continued)

*Primary Examiner* — Joseph A Miller, Jr.
(74) *Attorney, Agent, or Firm* — Patterson + Sheridan, LLP

(57) ABSTRACT

Embodiments described herein generally related to a substrate processing apparatus, and more specifically to an improved showerhead assembly for a substrate processing apparatus. The showerhead assembly includes a chill plate, a gas plate, and a gas distribution plate having a top surface and a bottom surface. A plurality of protruded features contacts the top surface of the gas distribution plate. A fastener and an energy storage structure is provided on the protruded features. The energy storage structure is compressed by the fastener and axially loads at least one of the protruded features to compress the chill plate, the gas plate and the gas distribution plate.

18 Claims, 5 Drawing Sheets

Related U.S. Application Data

(60) Provisional application No. 62/424,197, filed on Nov. 18, 2016.

(51) Int. Cl.
    *B05B 1/18*    (2006.01)
    *B05B 12/10*    (2006.01)
    *H01L 21/67*    (2006.01)

(52) U.S. Cl.
    CPC ........ *B05B 12/10* (2013.01); *H01J 37/32522* (2013.01); *H01J 37/32981* (2013.01); *H01L 21/67248* (2013.01); *H01J 2237/3341* (2013.01); *H01L 21/67069* (2013.01)

(56) References Cited

U.S. PATENT DOCUMENTS

| | | |
|---|---|---|
| 8,414,719 B2 | 4/2013 | Patrick et al. |
| 8,481,118 B2 | 7/2013 | Burrows et al. |
| 8,536,071 B2 | 9/2013 | Bettencourt et al. |
| 8,796,153 B2 | 8/2014 | Patrick et al. |
| 9,245,717 B2 | 1/2016 | Kang et al. |
| 2003/0010452 A1* | 1/2003 | Park .................. C23C 16/45565 156/345.33 |
| 2005/0050708 A1* | 3/2005 | Huang ................ C23C 16/4401 29/428 |
| 2005/0173569 A1* | 8/2005 | Noorbakhsh ..... C23C 16/45565 239/690 |
| 2009/0032189 A1 | 2/2009 | Jeong |
| 2009/0236040 A1* | 9/2009 | Patrick .............. H01J 37/32724 118/723 VE |
| 2011/0284100 A1* | 11/2011 | Kudela ............. H01J 37/32623 137/343 |
| 2014/0209027 A1* | 7/2014 | Lubomirsky ..... H01J 37/32146 118/724 |
| 2015/0225854 A1* | 8/2015 | Madsen .............. C23C 16/4409 438/697 |

FOREIGN PATENT DOCUMENTS

| | | |
|---|---|---|
| JP | 2010524205 A | 7/2010 |
| KR | 100920417 B1 | 10/2009 |
| KR | 101573947 B1 | 12/2015 |
| WO | 2008121288 A1 | 10/2008 |

OTHER PUBLICATIONS

Japanese Office Action for Application No. 2017-195675 dated Oct. 26, 2021.
Korean Office Action for Application No. 20-2017-0005868 dated Feb. 15, 2022.
Korean Office Action for Application No. 10-2017-0153042 dated Jan. 27, 2022.

* cited by examiner

THERMAL REPEATABILITY AND IN-SITU SHOWERHEAD TEMPERATURE MONITORING

CROSS-REFERENCE TO RELATED APPLICATION

This application is a continuation and claims the benefit of U.S. patent application Ser. No. 15/405,758, filed Jan. 13, 2017 and Provisional Application Ser. No. 62/424,197, filed Nov. 18, 2016, both of which are incorporated by reference in their entirety.

BACKGROUND

Field

Embodiments described herein generally related to a substrate processing apparatus, and more specifically to an improved showerhead assembly for a substrate processing apparatus.

Description of the Related Art

Semiconductor processing systems that perform "dry" etching of semiconductor substrate via plasmic gases, also known as reactive ion etching (RIE) require constant monitoring. While it is possible to predefine the etch parameters and allow the systems to perform the etch process unmonitored, conditions within the systems can change over time. For example, monitoring a temperature of a showerhead assembly for a substrate processing apparatus aids in providing temperature feedback that can aid in maintaining stable process control. Minute changes in the composition or pressure of an etch gas or process chamber or substrate temperature creates undesirable etch results.

Therefore, there is a need for an increase showerhead assembly for a substrate processing apparatus.

SUMMARY

Embodiments described herein generally related to a substrate processing apparatus, and more specifically to an improved showerhead assembly for a substrate processing apparatus. The showerhead assembly includes a chill plate, a gas plate, and a gas distribution plate having a top surface and a bottom surface. A plurality of protruded features contacts the top surface of the gas distribution plate. A fastener and an energy storage structure is provided on the protruded features. The energy storage structure is compressed by the fastener and axially loads at least one of the protruded features to compress the chill plate, the gas plate and the gas distribution plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
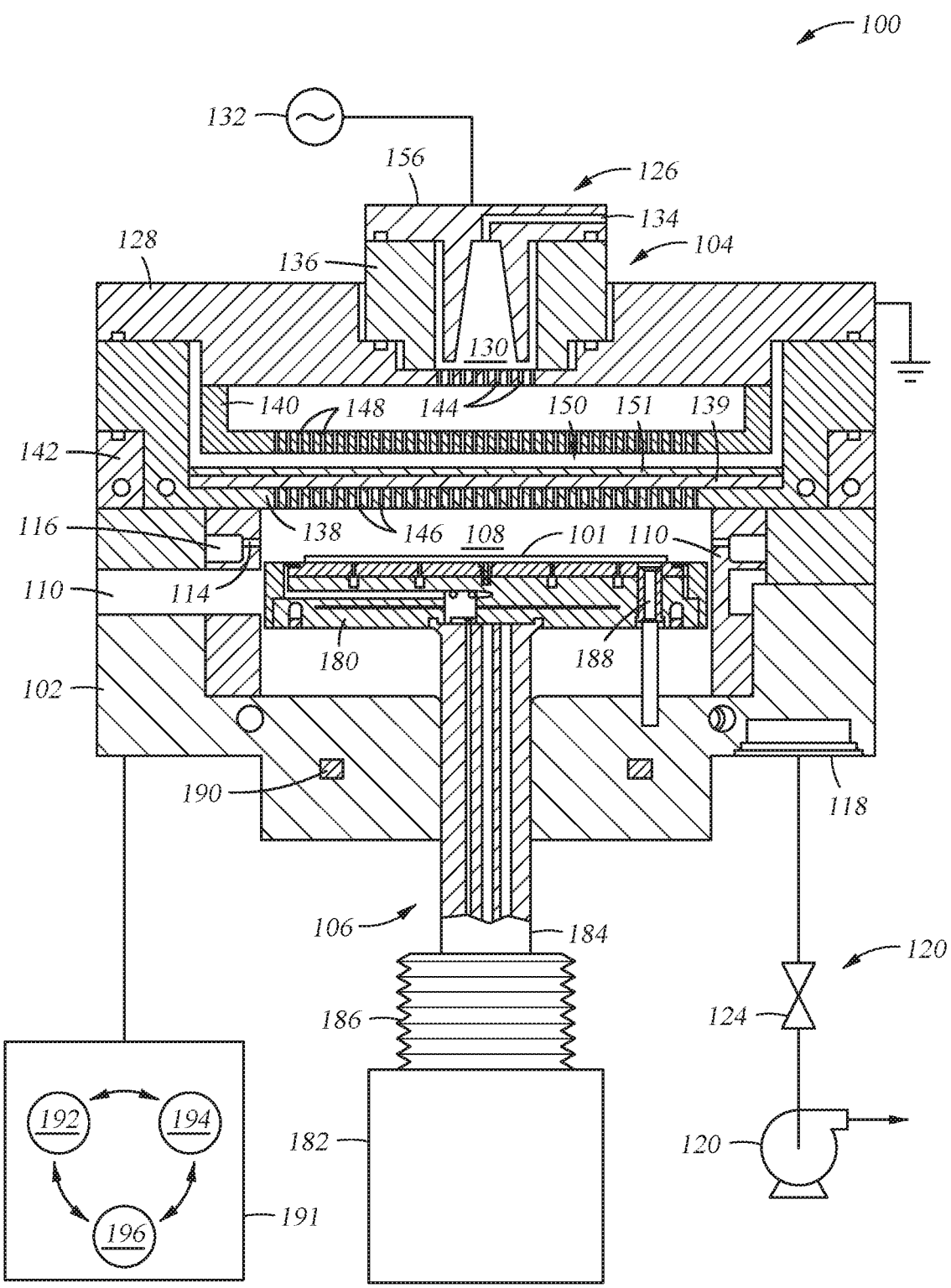
FIG. 1 illustrates a cross sectional view of a processing chamber, according to one embodiment.

FIG. 1 is a cross sectional view of a processing chamber 100 having an improved showerhead assembly 150, according to one embodiment. As shown, the processing chamber 100 is an etch chamber suitable for etching a substrate, such as substrate 101. Examples of processing chambers that may be adapted to benefit from exemplary embodiments of the disclosure are Sym3® Processing Chamber, and Mesa™ Processing Chamber, commercially available from Applied Materials, Inc., located in Santa Clara, Calif. It is contemplated that other processing chambers, including those from other manufacturers, may be adapted to benefit from exemplary embodiments of the disclosure.

The processing chamber 100 may be used for various plasma processes. In one embodiment, the processing chamber 100 may be used to perform dry etching with one or more etching agents. For example, the processing chamber may be used for ignition of plasma from a precursor $C_xF_y$, (where x and y can be different allowed combinations), $O_2$, $NF_3$, or combinations thereof.

The processing chamber 100 includes a chamber body 102, a lid assembly 104, and a support assembly 106. The lid assembly 104 is positioned at an upper end of the chamber body 102. The support assembly 106 is disclosed in an interior volume 108, defined by the chamber body 102. The chamber body 102 includes a slit valve opening 110 formed in a sidewall thereof. The slit valve opening 110 is selectively opened and closed to allow access to the interior volume 108 by a substrate handling robot (not shown) for substrate transfer.

The chamber body 102 may further include a liner 112 that surrounds the support assembly 106. The liner 112 is removable for servicing and cleaning. The liner 112 may be made of a metal such as aluminum, a ceramic material, or any other process compatible material. In one or more embodiments, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the chamber 100 to vacuum port 118.

A vacuum system 120 is coupled to the vacuum port 118. The vacuum system 120 may include a vacuum pump 122 and a throttle valve 124. The throttle valve 124 regulates the flow of gases through the chamber 100. The vacuum pump 122 is coupled to the vacuum port 118 disposed in the interior volume 108.

The lid assembly 104 includes at least two stacked components configured to form a plasma volume or cavity therebetween. In one or more embodiments, the lid assembly 104 includes a first electrode ("upper electrode") 126 disposed vertically above a second electrode ("lower electrode") 128. The upper electrode 126 and the lower electrode 128 confine a plasma cavity 130, therebetween. The first electrode 126 is coupled to a power source 132, such as an RF power supply. The second electrode 128 is connected to ground, forming a capacitor between the two electrodes 126, 128. The upper electrode 126 is in fluid communication with a gas inlet 134. The first end of the one or more gas inlets 134 opens into the plasma cavity 130.

The lid assembly 104 may also include an isolator ring 136 that electrically isolates the first electrode 126 from the second electrode 128. The isolator ring 136 may be made from aluminum oxide or any other insulative, processing compatible, material.

The lid assembly 104 may also include showerhead assembly 150 and, optionally, a blocker plate 140. The showerhead assembly 150 includes a gas distribution plate 138, a gas plate 139, and a chill plate 151. The showerhead assembly 150 is discussed in more detail in conjunction with FIGS. 2-3 below. The second electrode 128, the gas distribution plate 138, the chill plate 151, and the blocker plate 140 may be stacked and disposed on a lid rim 142, which is coupled to the chamber body 102.

In one or more embodiments, the second electrode 128 may include a plurality of gas passages 144 formed beneath the plasma cavity 130 to allow gas from the plasma cavity 130 to flow therethrough. The gas distribution plate 138 includes a plurality of apertures 146 configured to distribute the flow of gases therethrough. The blocker plate 140 may optionally be disposed between the second electrode 128 and the gas distribution plate 138. The blocker plate 140 includes a plurality of apertures 148 to provide a plurality of gas passages from the second electrode 128 to the gas distribution plate 138.

The support assembly 106 may include a support member 180. The support member 180 is configured to support the substrate 101 for processing. The support member 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the support member 180 to be moved vertically within the chamber body 102 between a lower transfer portion and a number of raised process positions. Additionally, one or more lift pins 188 may be disposed through the support member 180. The one or more lift pins 188 are configured to extend through the support member 180 such that the substrate 101 may be raised off the surface of the support member 180. The one or more lift pins 188 may be active by a lift ring 190.

The processing chamber may also include a controller 191. The controller 191 includes programmable central processing unit (CPU) 192 that is operable with a memory 194 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Charged species generation, heating, and other processes are generally stored in the memory 194, typically as software routine. The software routine may also be stored and/or executed by a second CPU (not shown) that is remotely located from the processing chamber 100 being controlled by the CPU 192.

The memory 194 is in the form of computer-readable storage media that contains instructions, that when executed by the CPU 192, facilitates the operation of the chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program (s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
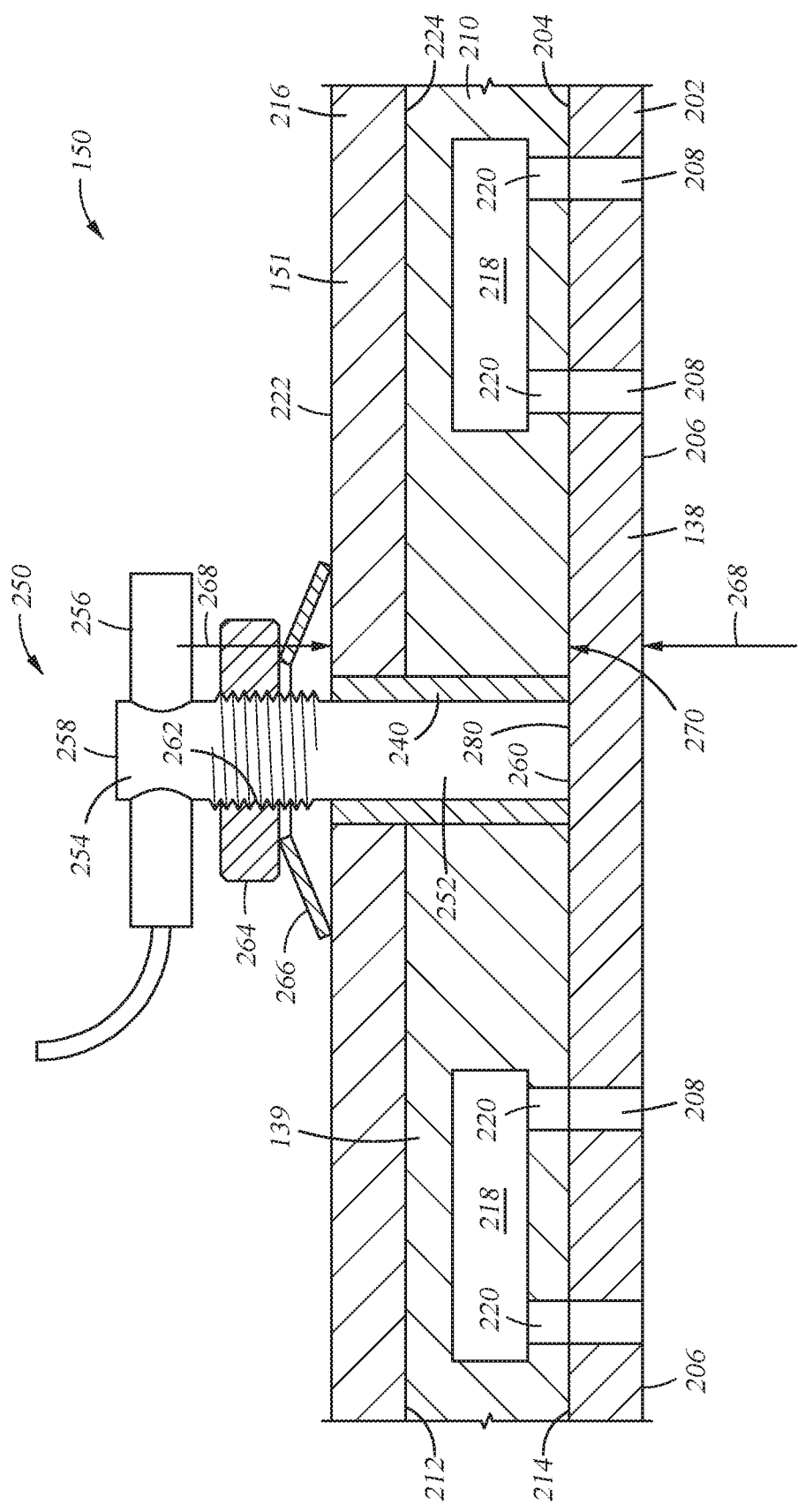
FIG. 2 illustrate a partial cross sectional view of the showerhead assembly of FIG. 1, according to one embodiment.

FIG. 2 illustrates a partial cross sectional view of the showerhead assembly 150, according to one embodiment. The showerhead assembly 150 includes the gas distribution plate 138, the gas plate 139 positioned on a top surface of the gas distribution plate 138, and the chill plate 151 positioned on a top surface of the gas plate 139. The gas distribution plate 138 includes a body 202 having a top surface 204 and a bottom surface 206. The bottom surface 206 faces the processing region of the processing chamber 100. One or more through holes 208 are formed through the body 202, extending from the top surface 204 to the bottom surface 206. The one or more through holes 208 are configured to allow passage of a processing gas through the gas distribution plate 138, and into the processing region.

Figure 3A:
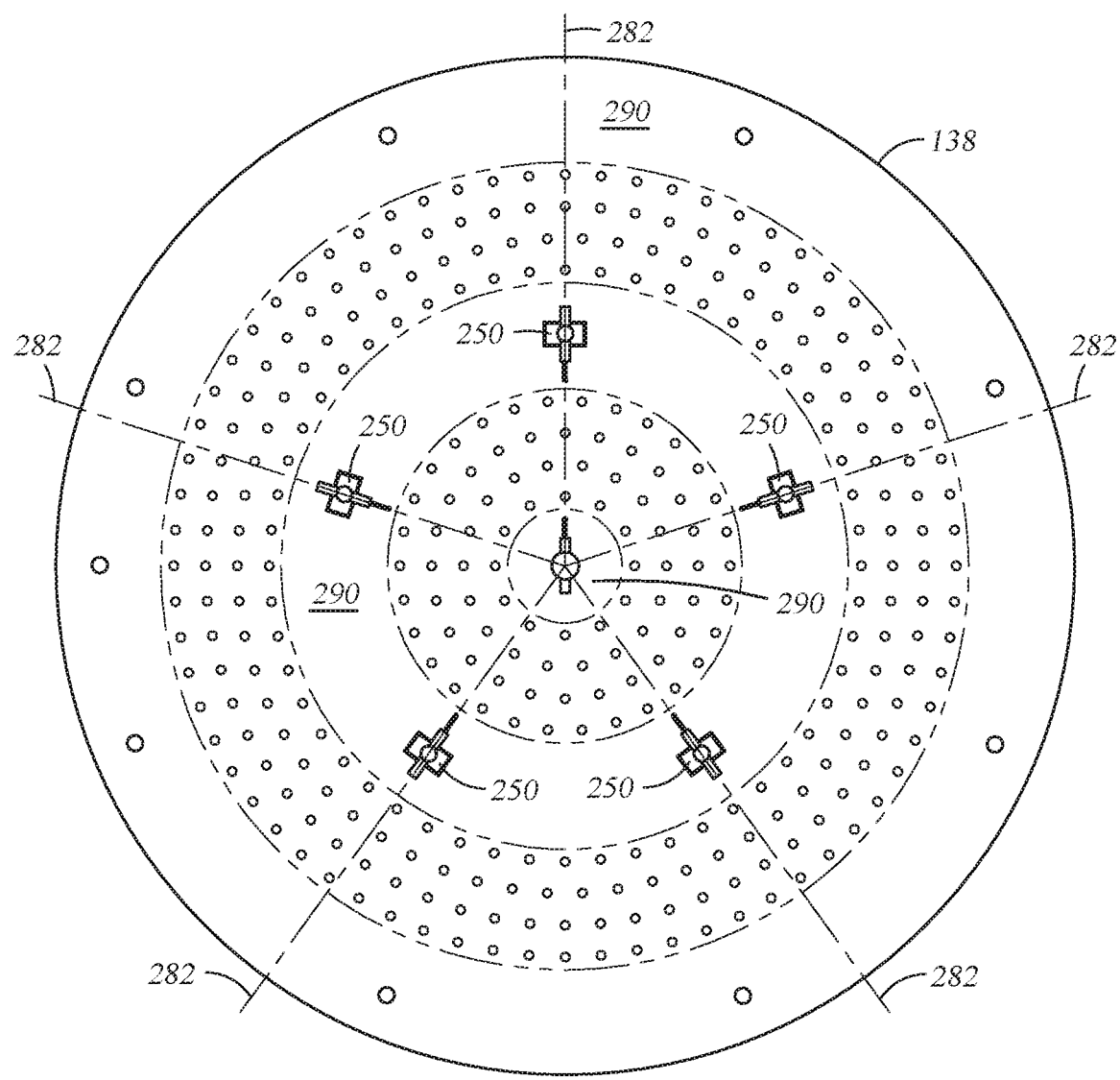
FIG. 3A illustrates a top view of the gas distribution plate of FIGS. 1 and 2, according to one embodiment.

FIG. 3A illustrates a top view of the gas distribution plate 138, according to one embodiment. As shown, the showerhead assembly 150 further includes one or more temperature detection assemblies 250. In one embodiment, the one or more temperature detection assemblies 250 are coupled to the top surface 204 of the gas distribution plate 138. The one or more temperature detection assemblies 250 are configured to monitor a temperature of the gas distribution plate 138 during processing. Each temperature detection assembly 250 includes a protruded feature 252 and a temperature probe 256. The protruded feature 252 is positioned in contact with the top surface 204 of the gas distribution plate 138. The protruded feature 252 may be formed from a similar material or the same as the gas distribution plate 138. For example, in one embodiment, the protruded feature 252 is formed from silicon, and the gas distribution plate 138 is formed from silicon. Forming the protruded feature 252 from a material similar to or the same as that of the gas distribution plate 138, allows enhanced heat transfer from the gas distribution plate 138 up through the protruded feature 252 to the temperature probe 256, thus increasing the accuracy of the temperature reading. In another example, the protruded feature 252 may be formed from a material having good thermal conductivity that is different than that of the gas distribution plate 138. For example, the protruded feature 252 may be formed from but not limited to aluminum, stainless steel, silicon carbide, aluminum nitride, and the like.

The temperature detection assemblies 250 may be selectively positioned on the gas distribution plate 138. For example, the temperature detection assemblies 250 may be positioned in an array about a center of the gas distribution plate 138. One temperature detection assembly 250 may be disposed through openings, 228, 272 formed through a centerline of the In the embodiment depicted in FIG. 3A, the temperature detection assemblies 250 are arranged in a grid pattern or a polar array about a centerline of the gas distribution plate 138, and in one example, centerlines 282 of the temperature detection assemblies 250 are spaced equidistantly apart. In another example, the temperature detection assemblies 250 are arranged in a ring that is concentric with the center of the gas distribution plate 138. Generally, the temperature detection assemblies 250 may be positioned on the gas distribution plate 138 in one or more through hole depleted areas 290. Hole depleted areas 290 are regions of the gas distribution plate 138 that do not have any gas through holes 208 formed therethrough. Positioning the temperature detection assemblies 250 in the through hole depleted areas 290 prevents the temperature detection assemblies 250 form interfering with the uniform process gas distribution into the process region.

The protruded feature 252 includes an elongated body having a top surface 258 and a bottom surface 260. The bottom surface 260 of the protruded feature 252 is interfaced with the top surface 204 of the gas distribution plate 138. In one embodiment, the protruded feature 252 may be thermally coupled to the top surface 204 by bonding the bottom surface 260 to the top surface 204 using a high thermal conduction material, thus creating a thermal bond 280. For example, the high thermal conduction material may be formed from but not limited to aluminum, titanium, a nickel-cobalt ferrous alloy, such as KOVAR®, and the like. In another embodiment, the protruded feature 252 may be integrally formed (i.e., formed as a homogeneous unitary body) are part of the gas distribution plate 138. For example, the protruded feature 252 and the gas distribution plate 138 may be a single unitary body. The thermal bond 280 between the gas distribution plate 138 and each of the one or more temperature detection assemblies 250 ensures fast and reliable detection of changes in temperature of the gas distribution plate 138 by the temperature probe 256.

Optionally, at least a portion of the at least one of the protruded features 252 extending above the upper (top) surface 222 of the chill plate 151 has a threaded section 262. The threaded section 262 allows a nut 264 to be threaded onto the threaded section 262 of the protruded feature 252 that is thermally bonded to the gas distribution plate 138 to compress resilient energy storage structure 266. The resilient energy storage structure 266 may be a compression spring, a coil spring, a flat spring form, a Belleville washer (i.e., a conical spring washer), a resilient elastomer or other force generating device/structure. The energy storage structure 266, when compressed by the nut 264, axially loads the protruded feature 252 to compress the chill plate 151, the gas plate 139 and the gas distribution plate 138 together as shown by compression arrows 268. Advantageously, since the gas plate 139 and the gas distribution plate 138 are urged together by the axial loading by the compressed energy storage structure 266, a region 270 of interface between the gas plate 139 and the gas distribution plate 138 adjacent the protruded feature 252 is maintained in close physical contact, thus ensuring that the temperature sensed by the temperature probe 256 through the protruded feature 252 is an accurate reading of the region of the gas distribution plate 138 adjacent the probe 256 rather than a pinpoint reading only representative of the temperature directly below the protruded feature 252. It is contemplated that the protruded feature 252 may be axially loaded in other manners to provide good compression between the gas plate 139 and the gas distribution plate 138 adjacent the protruded feature 252.

In one example, one or more or even all of the protruded features 252, each interfaced with a respective temperature probe 256, are axially loaded. In other examples, some of the protruded features 252 comprising the array may not be interfaced with a temperature probe 256, and one or more or even all of the temperature probe-less protruded features 252 (i.e., not interfaced with a temperature probe 256), are axially loaded. The array of axially loaded protruded features 252, probe-less or not, further ensure greater surface area of the gas plate 139 and the gas distribution plate 138 are clamped together in close physical contact, thus promoting temperature uniformity laterally across the gas distribution plate 138 even when exposed to plasma conditions in use. In summary, at least a first protruded feature 252 included in the array of the protruded features 252 includes the temperature probe 256, and the first protruded feature 252 may be axially loaded or not axially loaded. Protruded features 252 other than the first protruded feature 252 included in the array of the protruded features 252 may or may not include a temperature probe 256, and may or may not be axially loaded.

Continuing to refer to FIG. 2, the top surface 258 is opposite the bottom surface 260. The top surface 258 is configured to support the temperature probe 256. For example, in one embodiment a probe support 254 may be formed in the top surface 258 of the protruded feature 252. The probe support 254 may be an opening formed through the protruded feature 252 such that the temperature probe 256 is slideably positioned therein. In the example depicted in FIG. 2, the probe support 254 is a cross-hole formed through the protruded feature 252. In another example, the probe support 254 is a hole formed coaxially or parallel to the center axis of the protruded feature 252, such as, for example, a blind hole formed in the top surface 258 of the protruded feature 252 that allows the temperature probe 256 to be positioned inside the protruded feature 252 and at least partially below the chill plate 151 and closer to the gas distribution plate 138.

Figure 3B:
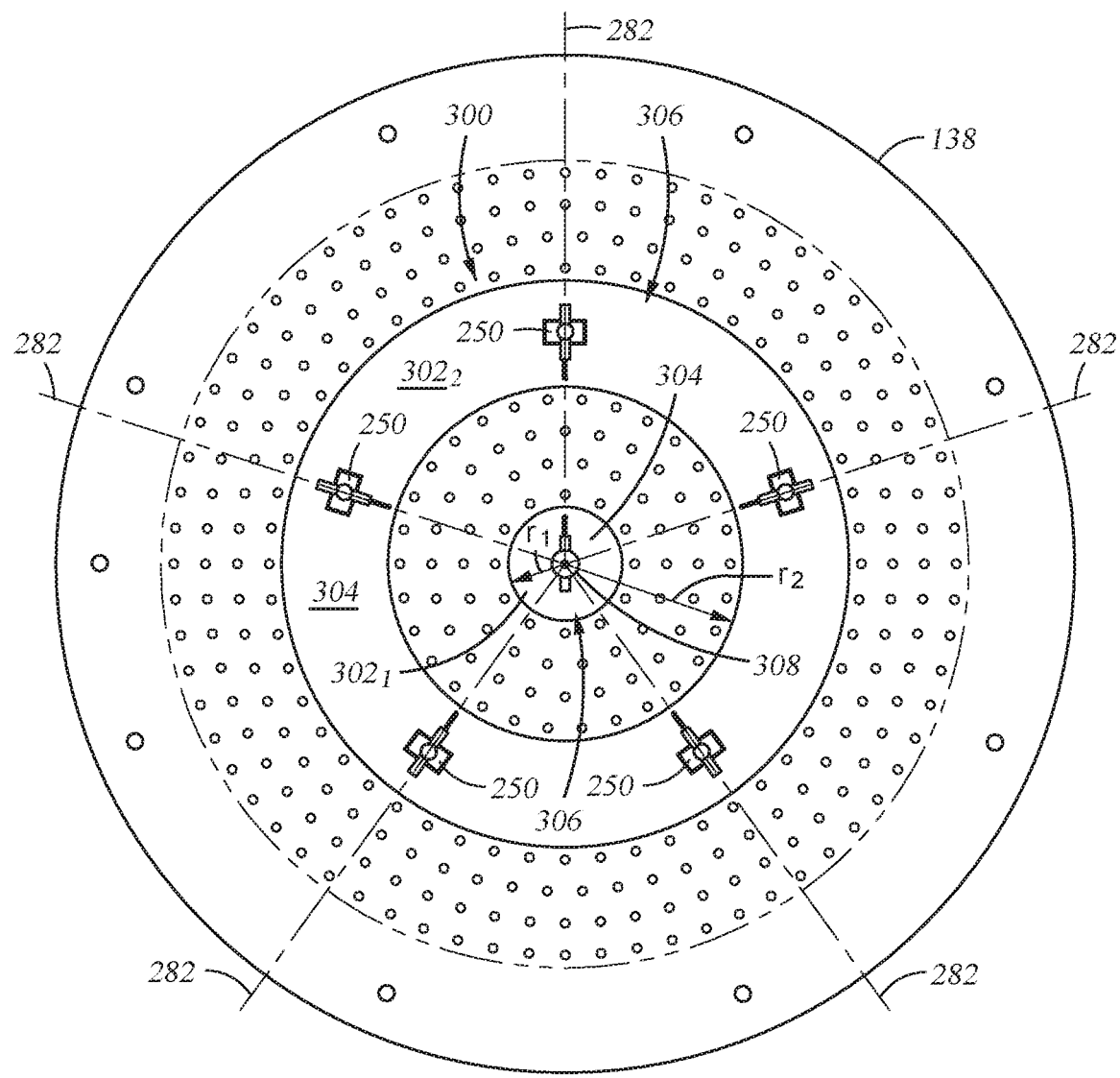
FIG. 3B illustrates a top view of the gas distribution plate of FIGS. 1 and 2, according to one embodiment.

FIG. 3B illustrates a top view of the gas distribution plate 138, according to another embodiment. In the embodiment shown, the showerhead assembly 150 includes a temperature detection assembly 300. The temperature detection assembly 300 is substantially similar to the temperature detection assembly 250. The temperature detection assembly includes one or more protruded features 302. Each of the one or more protruded features has a ring shaped body 304 that is concentric with the gas distribution plate 138. For example, FIG. 3B illustrates a first protruded feature 3021 having a first radius $r_1$ (measured from the center of the gas distribution plate 138) and a second protruded feature 3022 having a second radius $r_2$. The first radius $r_1$ is less than a radius, R, of the gas distribution plate 138. The second radius $r_2$ is less than the first radius $r_1$. Additionally, the one or more protruded features 302 are positioned on the gas distribution plate 138 in one or more through hole depleted areas 306. Positioning the one or more protruded features 302 in through hole depleted areas 306 ensures that the processing gas is evenly distributed into the processing region.

Conventional temperature monitoring systems employ a component embedded in the gas distribution plate. Embedding such components therein, however, can result in thermal inconsistencies in the base components (i.e., the gas distribution plate) having a thermal mismatch within the bodies of the gas distribution plate. Having the protruded feature 252 extending from the gas distribution plate 138, rather than embedded therein, such as that disclosed herein, ensures thermal homogeneity of the gas distribution plate 138.

The temperature detection assembly 300 may further include one or more probe support members 308 integrally formed with the one or more protruded features. The probe support members 308 may be formed from the same material as the one or more protruded features 302. Each probe support member 308 is configured to support a temperature probe 256. Each probe support member 308 is positioned such that the temperature probe 256 can be support over and above the chill plate 151.

Referring back to FIG. 2, the gas plate 139 includes a body 210 having a top surface 212 and a bottom surface 214. The bottom surface 214 is positioned over the top surface 204 of the gas distribution plate 138 such that substantially no gap is formed between the gas plate 139 and the gas distribution plate 138. The gas plate 139 includes one of more gas passages 218 and one or more gas delivery channels 220. The one or more gas passages 218 allow for the delivery of process gas from a gas source into the processing chamber. The one or more gas delivery channels 220 extend from the one or more gas passages 218 to the bottom surface 214 of the gas plate 139, allowing gas to flow from the one or more gas passages 218 and into the one or more through holes 208, and into the processing region. The gas plate 139 further includes openings 272 formed through the body 210. The openings 272 allow the protruded features 252 coupled to the gas distribution plate 138 to extend therethrough. Each of the openings 272 has a diameter such that the protruded feature 252 does not contact the gas plate 139. Such contact can lead to contamination in the temperature readings of the temperature probe 256.

The chill plate 151 includes a body 216 having a top surface 222 and a bottom surface 224. The bottom surface 224 is positioned over to the top surface 212 of the gas plate 139. The chill plate 151 is configured to regulate the temperature of the gas distribution plate 138 during processing. For example, the chill plate 151 may include one or more temperature control channels 226 formed therethrough such that a temperature control fluid may be provided therein to regulate the temperature of the gas distribution plate 138. The chill plate 151 further includes one or more openings 228 formed therethrough. The one or more openings 228 allow the protruded features 252 coupled to the gas distribution plate 138 to extend therethrough. Each of the one or more openings 228 has a diameter such that the protruded feature 252 does not contact the chill plate 151. Such contact can led to contamination in the temperature readings of the temperature probe.

In the embodiment shown in FIG. 2, the temperature detection assembly 250 may further include an insulative sleeve 240 at least partially surrounding the probe support 254 (or probe support member 308 in FIG. 3). The insulative sleeve 240 may be fabricated from a polymer or other suitable material. The insulative sleeve 240 is configured to insulate the temperature detection assembly 250 from the chill plate 151 and the gas plate 139. For example, in the embodiment shown in FIG. 2, the insulative sleeve 240 extends downwards, into the opening 228 of the chill plate 151 and the opening 272 of the gas plate 139, such that the insulative sleeve 240 completely surrounds the portion of the temperature detection assembly 250 that is within the openings 272 and 228.

Figure 4:
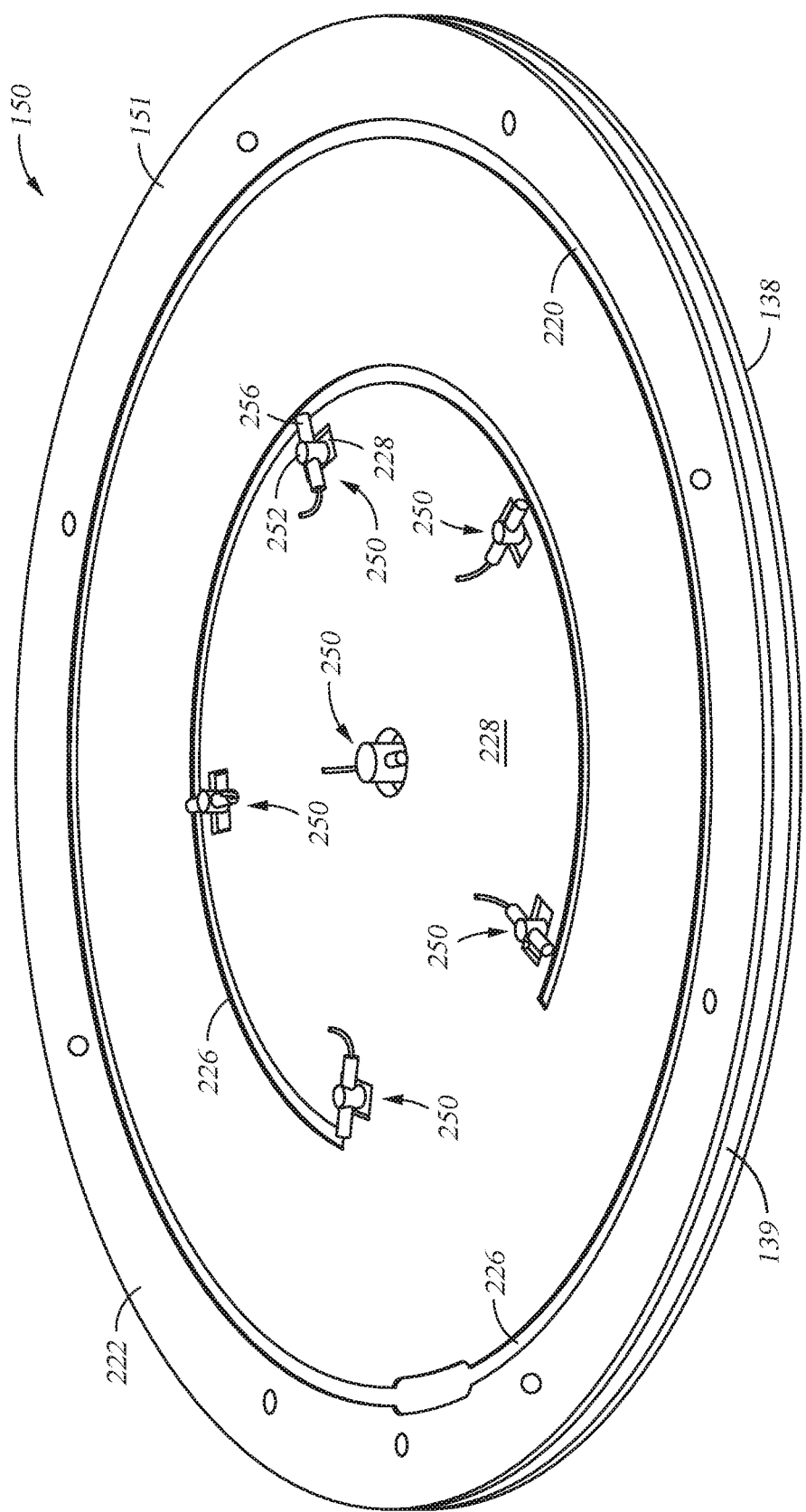
FIG. 4 illustrates a top view of the showerhead assembly of FIGS. 1 and 2, according to one embodiment.

FIG. 4 illustrates a top view of the showerhead assembly 150, according to one embodiment. As shown in FIG. 4, the one or more temperature detection assemblies 250 are positioned on the gas distribution plate 138. The one or more temperature detection assemblies 250 extend through the gas plate 139 and the chill plate 151, such that the temperature probe 256 is supported above the chill plate 151. Once positioned in the probe support 254, the temperature probe 256 is configured to measure the temperature of the gas distribution plate 138 by measuring the heat transferred up the protruded feature 252. The in-situ real-time temperature monitoring of the gas distribution plate 138 provides critical temperature feedback that aids in maintaining stable process control.

While the foregoing is directed to specific embodiments, other and further embodiments may be devised without departing from the basic scope thereof, and the scope thereof is determined by the claims that follow.

What is claimed is:

1. A showerhead assembly, comprising:
   a chill plate;
   a gas plate;
   a gas distribution plate having a top surface and a bottom surface;
   a plurality of protruded features contacting the top surface of the gas distribution plate and the protruding features extending through the chill plate and gas plate;
   a fastener; and
   an energy storage structure, wherein the energy storage structure is compressed by the fastener and axially loads at least one of the protruded features to compress the chill plate and the gas plate.

2. The showerhead assembly of claim 1, wherein the gas plate has a top surface and a bottom surface, the gas plate has one or more openings formed through the gas plate from the top surface and the bottom surface, the bottom surface of the gas plate is positioned over the top surface of the gas distribution plate such that the protruded feature extends through the opening of the gas plate.

3. The showerhead assembly of claim 2, wherein the chill plate comprises:
   a top surface;
   a bottom surface; and
   one or more openings formed from the top surface to the bottom surface, the bottom surface of the chill plate is positioned over the top surface of the gas plate such that the protruded feature extends through the opening of the chill plate.

4. The showerhead assembly of claim 3, wherein a top surface of each protruded feature includes a probe support that is configured to support a temperature probe within the protruded feature and above the chill plate.

5. The showerhead assembly of claim 1, wherein the showerhead assembly further comprises:
   one or more insulative sleeves, wherein each insulative sleeve at least partially surrounds the protruded feature.

6. The showerhead assembly of claim 1, wherein the gas distribution plate includes a plurality of through holes, the plurality of through holes arranged on the gas distribution plate in one or more zones.

7. The showerhead assembly of claim 1, wherein at least some of the protruded features are arranged in a ring concentric with the gas distribution plate.

8. The showerhead assembly of claim 1, wherein at least some of the protruded features are arranged in a grid pattern on the gas distribution plate.

9. The showerhead assembly of claim 1, wherein at least one of the protruded features is not axially loaded.

10. A processing chamber, comprising:
    a substrate support member configured to support a substrate; and
    a showerhead assembly, comprising:
        a chill plate;
        a gas plate;
        a gas distribution plate having a top surface and a bottom surface;
        a plurality of protruded features contacting the top surface of the gas distribution plate and the protruding features extending through the chill plate and gas plate;
        a fastener; and
        an energy storage structure, wherein the energy storage structure is compressed by the fastener and axially loads at least one of the protruded features to compress the chill plate and the gas plate.

11. The processing chamber of claim 10, wherein the gas plate has a top surface and a bottom surface, the gas plate has one or more openings formed through the gas plate from the top surface and the bottom surface, the bottom surface of the gas plate is positioned over the top surface of the gas distribution plate such that the protruded feature extends through the opening of the gas plate.

12. The processing chamber of claim 11, wherein the chill plate comprises:
    a top surface;
    a bottom surface; and
    one or more openings formed from the top surface to the bottom surface, the bottom surface of the chill plate is positioned over the top surface of the gas plate such that the protruded feature extends through the opening of the chill plate.

13. The processing chamber of claim 12, wherein a top surface of each protruded feature includes a probe support that is configured to support a temperature probe within the protruded feature and above the chill plate.

14. The processing chamber of claim 10, wherein the showerhead assembly further comprises:
    one or more insulative sleeves, wherein each insulative sleeve at least partially surrounds the protruded feature.

15. The processing chamber of claim 10, wherein the gas distribution plate includes a plurality of through holes, the plurality of through holes arranged on the gas distribution plate in one or more zones.

16. The processing chamber of claim 10, wherein at least some of the protruded features are arranged in a ring concentric with the gas distribution plate.

17. The processing chamber of claim 10, wherein at least some of the protruded features are arranged in a grid pattern on the gas distribution plate.

18. The processing chamber of claim 10, wherein at least one of the protruded features is not axially loaded.

* * * * *